United States Patent

Kuhn et al.

[11] Patent Number: 5,498,961
[45] Date of Patent: Mar. 12, 1996

[54] MR METHOD FOR TWO-DIMENSIONAL OR THREE-DIMENSIONAL IMAGING OF AN EXAMINATION ZONE, AND APPARATUS FOR CARRYING OUT THE METHOD

[75] Inventors: Michael H. Kuhn; Volker Rasche; Roland Proksa, all of Hamburg, Germany

[73] Assignee: U.S. Philips Corporation, New York, N.Y.

[21] Appl. No.: 207,529

[22] Filed: Mar. 7, 1994

[30] Foreign Application Priority Data

Mar. 6, 1993 [DE] Germany ............... 43 07 150.3
Jun. 12, 1993 [DE] Germany ............... 43 19 538.5

[51] Int. Cl.⁶ ........................................... G01V 3/14
[52] U.S. Cl. ................................. 324/309; 324/307
[58] Field of Search ....................... 324/300, 307, 324/309

[56] References Cited

U.S. PATENT DOCUMENTS 4,710,717 12/1987 Pelc et al. .................... 324/309
4,982,328 1/1991 Kasugai ..................... 364/413.22

FOREIGN PATENT DOCUMENTS 0257922 3/1988 European Pat. Off. .
0273153 7/1988 European Pat. Off. .

Primary Examiner—Sandra L. O'Shea
Assistant Examiner—Mack Haynes
Attorney, Agent, or Firm—Jack D. Slobod

[57] ABSTRACT

The invention relates to an MR method for two-dimensional or three-dimensional imaging of an examination zone, in which a set of raw data is measured repeatedly, an image of the examination zone can be reconstructed from each set, and the raw data of a set is acquired with different measurement parameters, and different sets contain raw data acquired with the same measurement parameters. Improved temporal resolution is achieved in that a set of auxiliary data is formed from at least two sets of raw data in order to produce an image representing the examination zone at a selectable instant, the auxiliary data being derived by interpolation from the raw data acquired with each time the same measurement parameters but at different measurement instants, the weight applied to the raw data entering the interpolation being greater as the time interval between the associated measurement instant and the selectable instant is smaller, the image of the examination zone being reconstructed from the set of auxiliary data.

9 Claims, 3 Drawing Sheets

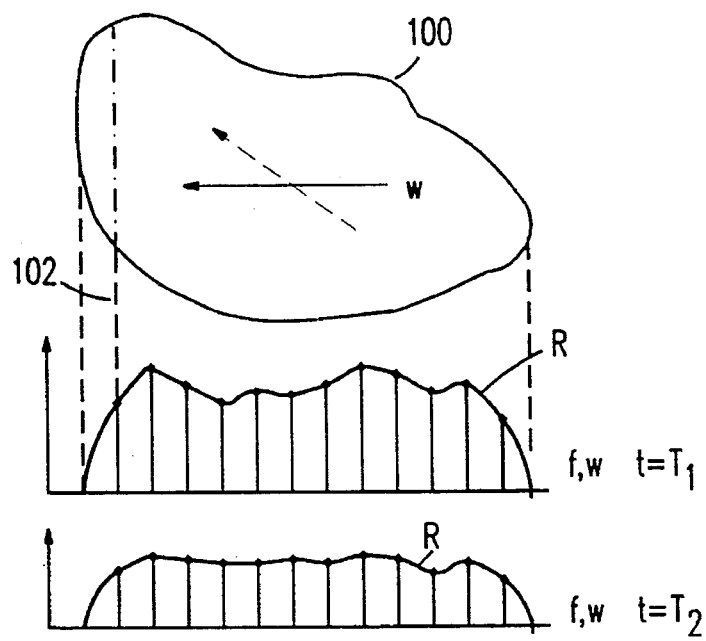
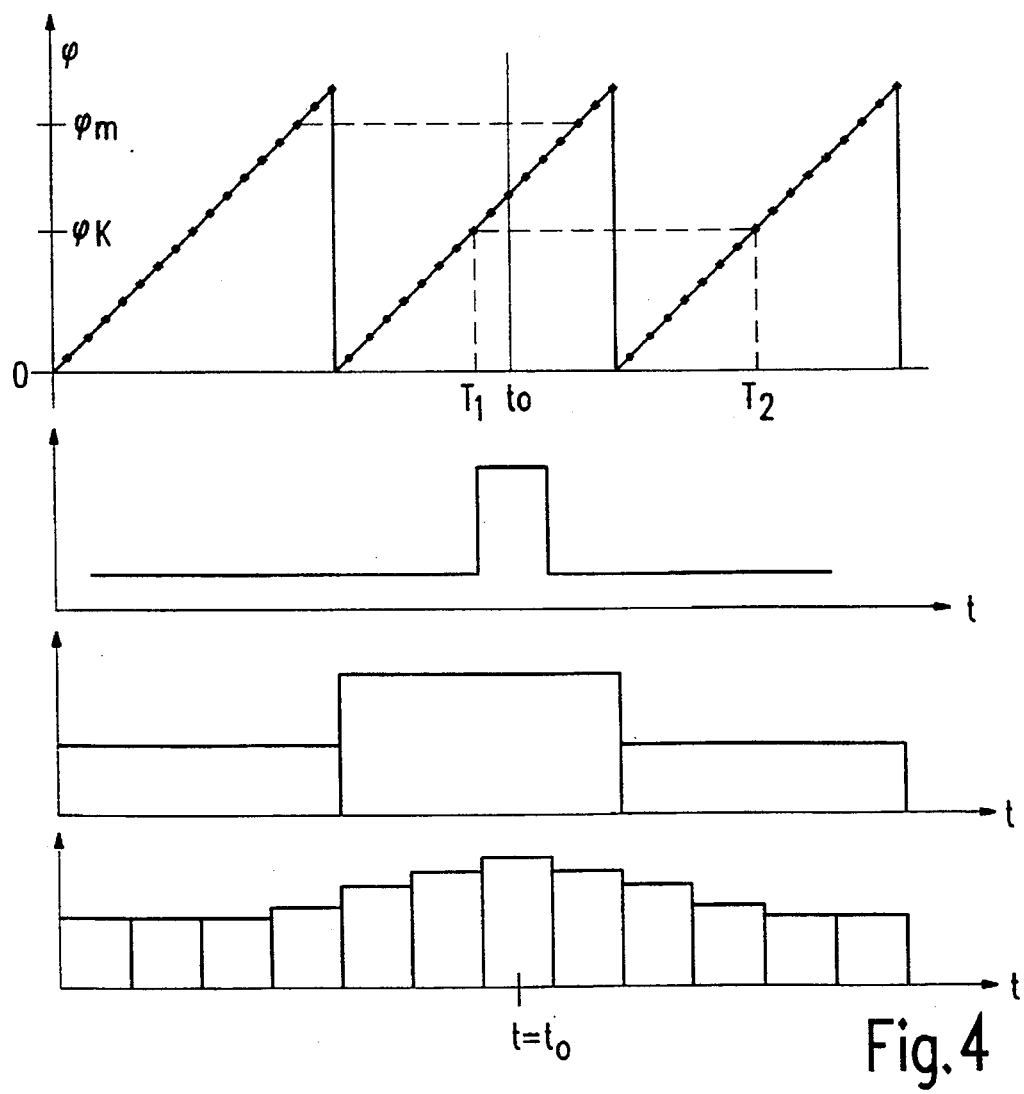
Fig.3
Fig.4

MR METHOD FOR TWO-DIMENSIONAL OR THREE-DIMENSIONAL IMAGING OF AN EXAMINATION ZONE, AND APPARATUS FOR CARRYING OUT THE METHOD

BACKGROUND OF THE INVENTION

1. Field of the Invention

The invention relates to an MR method for two-dimensional or three-dimensional imaging of an examination zone, in which a set of raw data is repeatedly measured and an image of the examination zone can be reconstructed from each set, in which the raw data of a set is acquired with different measurement parameters, and in which different sets contain raw data acquired with the same measurement parameters.

2. Description of the Related Art

Measurement parameters in this respect are magnitude and/or direction of the magnetic gradient fields acting, or having acted, on the examination zone as from the excitation of the nuclear magnetization in the examination zone by one or more RF pulses until acquisition of the MR signal. The temporal resolution of an MR image produced by an MR method (MR=Magnetic Resonance) is determined by the measurement period within which the set of raw data required for an MR image can be acquired. Dynamic processes in the examination zone, for example the propagation of a contrast medium, which occur within a period of time which is shorter than the measurement period can also influence an MR image, but the known method of the kind set forth cannot provide an indication as to when these processes have occurred during the measurement period. A similar limitation in respect of spatial resolution occurs in the case of slice images of a moving patient.

It is to be noted that from U.S. Pat. No. 4,710,717 an MR method is known for the imaging of periodically pulsating objects, notably the human heart, in which several sets of raw data are measured, the position in time relative to the cardiac cycle during which they are acquired being assigned to the raw data by way of an ECG signal. The sets of raw data, however, are not measured successively in time, but quasi-simultaneously in that during each cardiac cycle several MR sequences with identical magnetic gradient fields act on the examination zone. The phase encoding gradients are changed from one cardiac cycle to another, so that the acquisition of the raw data sets is completed after a number of cardiac cycles which is dependent on the spatial resolution. The reconstruction of the examination zone in a given phase of the cardiac cycle utilizes the raw data measured during this phase in the individual cardiac cycles. If no raw data has been acquired during the relevant phase in a cardiac cycle, the desired raw data is calculated from the raw data of these sequences measured directly before and directly after the desired phase in the relevant cardiac cycle.

The MR image reconstructed by means of this data thus contains data from each cardiac cycle, so that improvement of the temporal resolution is not possible. The possibility of imaging individual phases of the cardiac action with a comparatively small amount of motional unsharpness is based on the fact that the nuclear magnetization distribution in the examination zone is periodically recurrent. When this is not the case, for example in the event of an examination by means of a contrast medium (during the phase in which the contrast medium flows into the examination zone), the known method fails.

SUMMARY OF THE INVENTION

Therefore, it is an object of the present invention to provide a method offering improved resolution in time or space as well as an apparatus which is suitable for carrying out this method.

On the basis of a method of the kind set forth, this object is achieved in that, in order to produce an image representing the examination zone at a selectable instant or in a selectable slice, a set of auxiliary data is formed from at least two sets of raw data, the auxiliary data being derived by interpolation from the raw data acquired with the same measurement parameters, but at different measurement instants, or derived for different measurement slices, that the weight applied to the raw data entering the interpolation is greater as the time interval between the associated measurement instant and the selectable instant, or between the measurement slice and the selected slice, is smaller, and that the image of the examination zone is reconstructed from the set of auxiliary data.

Thus, in accordance with the invention the images of the examination zone are not reconstructed directly from the raw data as is customary thus far, but from the auxiliary data derived from the raw data by interpolation. This interpolation takes into account the instants of measurement of the raw data (or the position of the measurement slice) as well as the selectable instant (or the position of the selected layer) for which an image of the examination zone is to be reconstructed. It can be demonstrated that the temporal resolution can then be higher than the value corresponding to the measurement period required for acquisition of a set of raw data. The same holds for the spatial resolution in the direction of movement of a moving object.

Full benefit can be derived from the advantages of the invention in that several sets of auxiliary data are generated, which sets represent the examination zone at different, preferably equidistant instants, or in different slices, and that the images reconstructed therefrom are displayed as a sequence of images, notably when the number of these images is large in comparison with the number of sets of raw data.

The invention can in principle be carried out with any known MR method allowing for sufficiently fast acquisition of a set of raw data. In a preferred embodiment of the invention, however, the examination zone is imaged by way of an MR method in which a uniform, steady magnetic field acts on an examination zone, initially a first sequence which comprises at least one RF pulse acting on the examination zone in order to generate a first set of raw data, the MR signal thus generated being read in the presence of a magnetic gradient field having a gradient extending in a first direction, said first sequence being succeeded by further, similar sequences, the direction of the gradient being varied from one sequence to another until all directions have been traversed, a first set of raw data being produced by one-dimensional Fourier transformation over the MR signal acquired during these sequences, and the series of sequences being repeated at least once in order to obtain at least one further set of raw data.

The MR method on which this version is based and which is known as the projection reconstruction method has the property that each sequence provides information concerning all spatial frequency components of the examination zone as opposed to, for example the 2-DF method in which only the sequence for which the phase encoding gradient has the value zero provides information concerning the deep space frequency components.

According to a further version of the method, an object to be examined is moved relative to the examination zone during the examination, sets of raw data being continuously measured during the movement, at least one set of auxiliary data being formed from said raw data, a respective MR image being reconstructed from said auxiliary data. This enables the formation of a sequence of cross-sectional images of the body already during the introduction of the (patient's) body into the examination zone, the spatial resolution in the movement direction already having been improved.

An MR apparatus for carrying out the method in accordance with the invention comprises a magnet for generating a uniform, steady magnetic field, a gradient coil system for generating a magnetic gradient field whose gradient can be varied in respect of magnitude and/or direction, at least one RF coil system for generating RF pulses or for receiving MR signals, means for generating raw data from the MR signals, a control unit for controlling said means and coil systems so that several sets of raw data are formed, an interpolation unit for generating at least one set of auxiliary data from each time two or more sets of raw data, and a reconstruction unit for reconstructing an MR image of the examination zone from a set of auxiliary data.

BRIEF DESCRIPTION OF THE DRAWING

The invention will be described in detail hereinafter with reference to the drawing. Therein:

FIG. 3 shows the raw clam acquired by this sequence in relation to the examination zone, FIG. 4 shows the progression in time of the examination method.

DETAILED DESCRIPTION OF THE PREFERRED EMBODIMENTS

Figure 1:
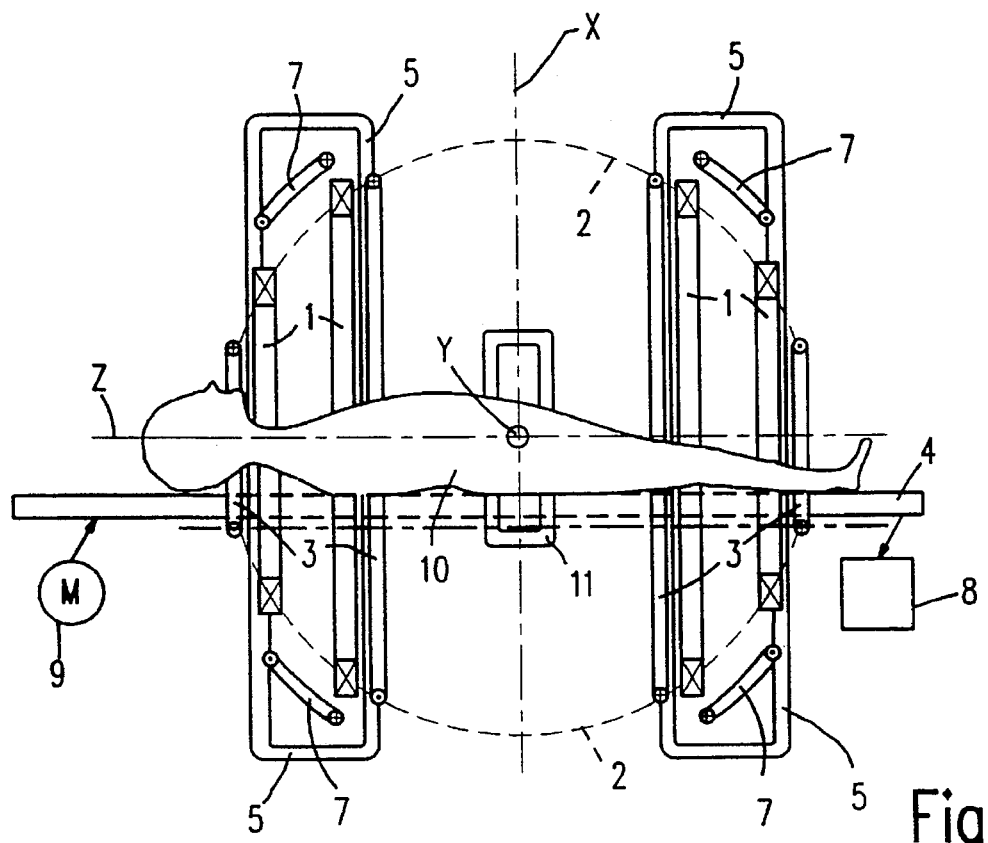
FIG. 1 shows an apparatus for carrying out the method in accordance with the invention.

The apparatus shown in FIG. 1 is an MR apparatus which comprises a system of four coils 1 for generating a steady, uniform magnetic field whose strength is of the order of magnitude of from some tenths of Tesla to some Tesla. The coils 1, being concentrically arranged relative to the z axis, may be provided on a spherical surface 2. The patient 10 to be examined is arranged on a table 4 which is positioned inside these coils.

In order to produce a magnetic field which extends in the z direction and which linearly varies in this direction (which field is also referred to hereinafter as the gradient field), four coils 3 are provided on the spherical surface 2. Also present are four coils 7 which generate a gradient field which also extends in the z direction but whose gradient extends (vertically) in the x direction. A magnetic gradient field extending in the z direction and having a gradient in the y direction (perpendicularly to the plane of drawing of FIG. 1) is generated by four coils 5 which may be identical to the coils 7 but which are arranged so as to be offset 90° in space with respect thereto. Only two of these four coils are shown in FIG. 1.

Because each of the three coil systems 3, 5 and 7 for generating the magnetic gradient fields is symmetrically arranged relative to the spherical surface, the field strength at the centre of the sphere is determined exclusively by the steady, uniform magnetic field of the coil 1.

Also provided is an RF coil 11 which generates an essentially uniform RF magnetic field which extends perpendicularly to the direction of the steady, uniform magnetic field (i.e. perpendicularly to the z direction). The RF coil receives an RF modulated current from an RF generator during each RF pulse. The RF coil 11 can also be used for receiving the spin resonance signals generated in the examination zone. However, it is alternatively possible to use a separate RF coil (not shown in FIG. 1) for this purpose.

Figure 2:
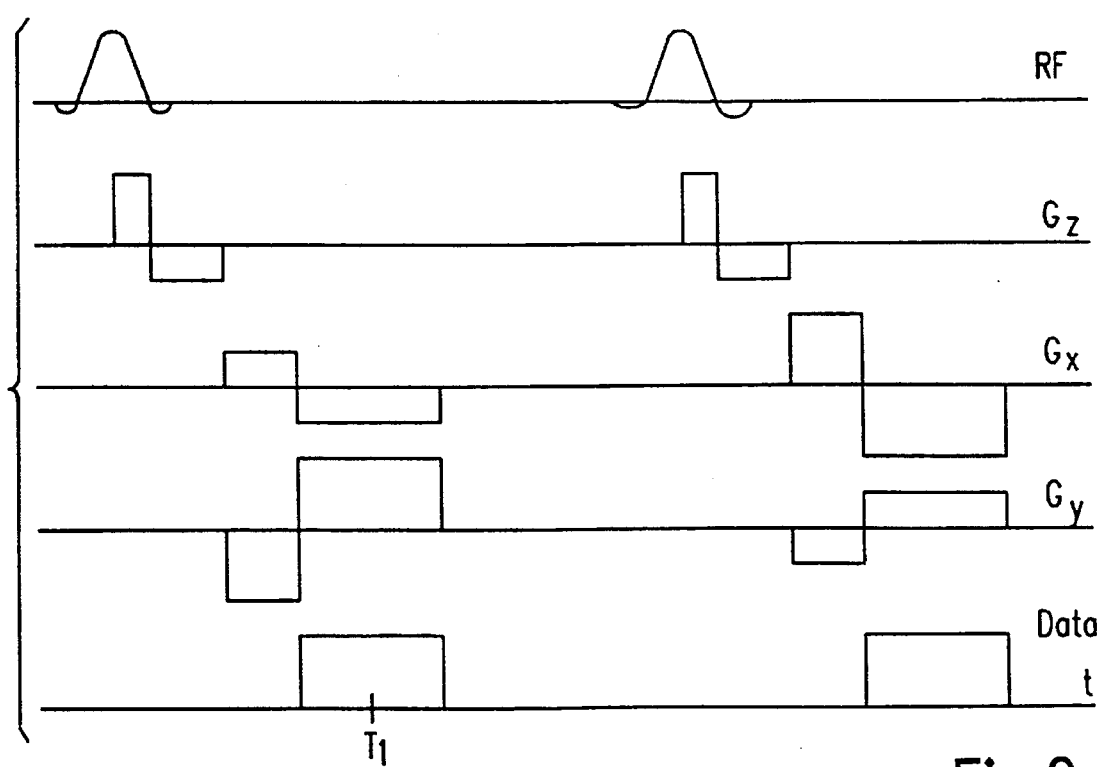
FIG. 2 shows the progression in time of various signals in a sequence which is particularly suitable for acquiring MR raw data for this method.
Figure 5:
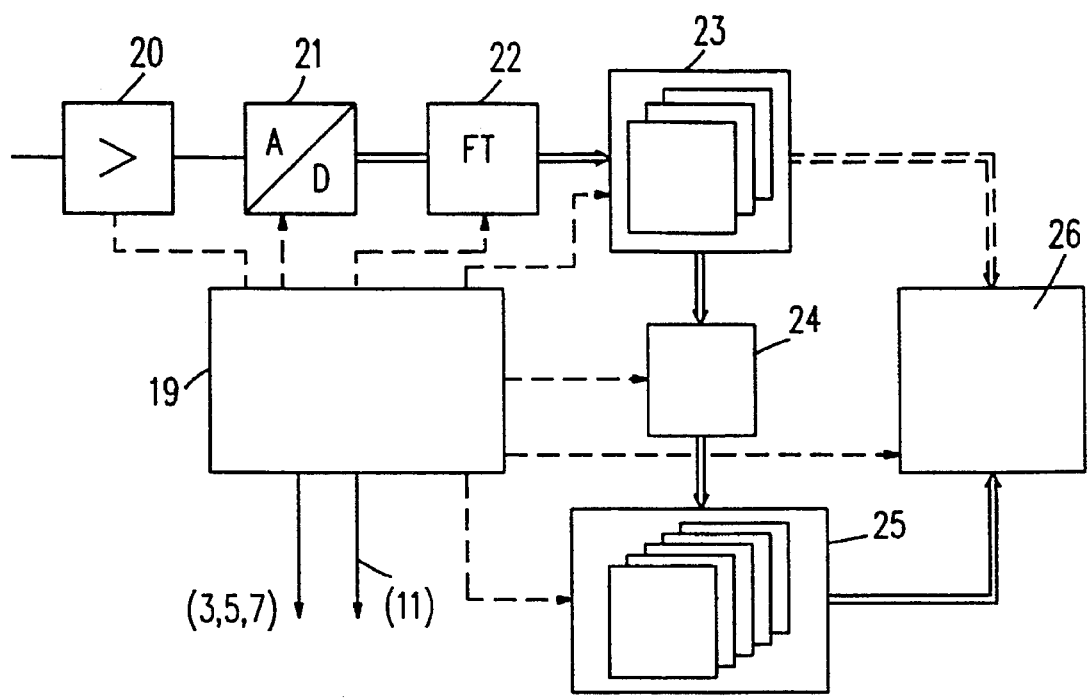
FIG. 5 shows a circuit diagram of the apparatus shown in FIG. 1.

FIG. 2 shows the position in time of various signals during two successive sequences which are particularly suitable for carrying out the method in accordance with the invention. The first line shows an RF pulse which acts as a slice-selective RF pulse in conjunction with a magnetic gradient field $G_z$ (second line). This RF pulse rotates the nuclear magnetization in a slice perpendicular to the z axis out of its rest position through a small flip angle (for example, 5°). Subsequently, two magnetic gradient fields $G_x$ and $G_y$ act simultaneously on the examination zone, both fields reversing the direction of the gradient at a given instant (third and fourth lines). The progression in time is chosen so that the time integral over the gradient until the polarity reversal amounts to half the time integral from the polarity reversal until deactivation of the magnetic gradient field. In principle however, the part of the magnetic gradient field before the polarity reversal can be dispensed with, so that for the x direction and the y direction a respective, essentially constant magnetic gradient field acts simultaneously on the examination zone.

During this constant magnetic gradient field, the MR signals generated in the examination zone are amplified, transposed in the baseband and digitized (fifth line of FIG. 2). The number of sampling values thus acquired is dependent on the desired resolution as well as on the magnitude of the examination zone and amounts to, for example 128 or 256. The sequence is repeated a number of times, for example 128 or 256 times, the magnitude of the gradients $G_x$ and $G_y$ being changed in an opposite sense from one sequence to another, so that the sum of the squares of these gradients remains constant. Consequently, the direction of the magnetic field resulting from the superposition of the magnetic gradient fields $G_x$ and $G_y$ changes in the z plane, the absolute value of its gradient remaining constant. The direction of the gradient field arising from the superposition of $G_x$ and $G_y$ is thus changed from one sequence to another until an angular range of at least 180° has been traversed (the method can also be carried out so that a complete set of raw data is obtained only after an angular range of 360° has been traversed). The so-called repetition time (being the period of time elapsing between the two RF pulses) may then amount to, for example 20 ms, so that the time for acquisition of the MR signals required for an image amounts to approximately 5 seconds when the angle of 180° or 360° is covered by way of 256 sequences.

The digitized MR signals are subjected to a one-dimensional Fourier transformation, after which as many transformed values become available as there were previously sampling values. An image of the examination zone can be reconstructed from these transformed values by means of a so-called filtered back-projection. The described MR method, including the reconstruction steps, is generally known to those skilled in the art as the so-called projection-reconstruction method.

In FIG. 3 the slice excited by the sequences is denoted by the reference numeral 100 and the direction of the magnetic gradient field in this slice, for example during the first sequence, is denoted by the arrow w. Below the examination zone there is shown the curve R which represents the frequency spectrum of the MR signal acquired during a sequence.

This frequency spectrum results from the one-dimensional Fourier transformation of the MR signal. Remembering that the frequency of the nuclear spins varies linearly as a function of the location along the straight line w in the projection-reconstruction method, it follows that the amplitude of the frequency spectrum R represents the projection of the nuclear magnetization on the line w, i.e. the line integral of the nuclear magnetization density over a path perpendicular to the line w within the slice, for a given location. Thus, for each location on the line w this projection is obtained from the curve R as denoted by the dashed line 102 for a given location.

Below the curve R there is shown a further curve which also represents the projection of the nuclear magnetization on the line w in the examination zone, be it at a later instant as will be described in detail hereinafter with reference to FIG. 4.

The upper diagram of FIG. 4 shows the progression in time when a plurality of sets of raw data are acquired, the gradient direction being plotted as the ordinate whereas the time is plotted as the abscissa. Each point in this diagram corresponds to the acquisition of an MR signal. The MR signal per se is acquired during a finite period of time, see FIG. 2, fifth line; however, because the duration of this period of time is negligibly small in relation to the time required for acquiring a complete set of raw data, it will be assumed hereinafter that all MR data acquired during acquisition of a single MR signal has been acquired at the same instant as symbolized by a point in the diagram. The distance in time between two successive points, therefore, corresponds to the repetition time of the sequence shown in FIG. 2.

As appears from the diagram, the overall angular range $\phi$ (from 0° to 360°) is covered uniformly by the successive sequences. After a first set of raw data has been acquired in this manner, immediately a further measurement period commences, during which a second set of raw data is acquired, followed by a third set, etc. In conformity with the diagram, the raw data of a set is traversed with a (step-wise) increasing direction of the gradient; however, any other order is also possible within a measurement period; it is necessary, however, to maintain this order in the second and the third measurement period.

According to the projection-reconstruction methods known thus far images of the examination zone are always reconstructed from the raw data acquired during a measurement period. In accordance with the invention, however, first an instant is selected for which an image of the examination zone is to be reconstructed. For this instant, for example $t_0$, auxiliary data is determined by interpolation from the raw data of (at least) two sets of raw data associated with the same measurement parameter, i.e. (for the projection-reconstruction method) the same direction $\phi$ of the gradient. For the direction $\phi_k$, for example the auxiliary data is calculated from the raw data determined at the instants $t_1$ and $t_2$ in accordance with the formula.

$$H(\phi_k,t_0)=g_k \cdot R(\phi_k,t_1)+(1-g_k) \cdot R(\phi_k,t_2) \qquad (1)$$

Therein, $H(\phi_k,t_0)$ represents the auxiliary data for the measurement parameter $\phi_k$ and the selected instant $t_0$, whereas $R(\phi_k,t_1)$ and $R(\phi_k,t_2)$ represent the raw data with the same measurement parameter $\phi_k$ and the measurement instants $t_1$ and $t_2$. $g_k$ is an interpolation factor associated with the measurement parameter $\phi_k$, which interpolation factor is greater as the absolute value of the difference $t_1$-$t_0$ is smaller. In the simplest case, $g_k$ is subject to a linear dependency in conformity with the equation:

$$g_k=(t_2-t_0)/(t_2-t_1) \qquad (2)$$

In conformity with these relations, auxiliary data can be acquired for all other measurement parameters, it merely being necessary to replace $\phi_k$ in the equation (1) by the relevant measurement parameter $\phi$. When this value $\phi$ so in the measurement period in which $t_0$ is situated (i.e. in the second measurement period) was given before the instant $t_0$ (like, for example $\phi_k$), the raw data of the relevant set and the next set of raw data must be used for interpolation. However, if the value $\phi$ was given only after $t_0$ (like, for example $\phi_m$), the raw data of the relevant set and the preceding set of raw data must be used for the interpolation. Thus, for the relevant measurement parameter ($\phi_m$ or $\phi_k$) in principle the raw data must be used which have been measured at the smallest distance in time from the instant $t_0$. The auxiliary data set ultimately contains exactly as many auxiliary data for the predetermined instant $t_0$ as raw data have been acquired during a measurement period.

As appears from FIG. 3, at the instant ($t_1$ or $t_2$) not a single value but a number of raw data is acquired, for example 128 or 256. In order to calculate the values in conformity with the equations (1) and (2), therefore, each value in the curve R for the instant $t=t_1$ must be interpolated with the corresponding value (i.e. the value associated with the same location) in the curve $t=t_2$, so that therefrom a sub-set of auxiliary data is determined. For these interpolations the same interpolation factor is used. The closer the instant $t_0$ is situated to the instant $t_1$, the more the variation of the auxiliary data thus determined corresponds to the curve R for $t=t_1$ and vice versa.

As has already been stated, an image of the examination zone can be reconstructed from the progression in time of the sequences for the projection-reconstruction method shown in FIG. 2 also when only an angular range of from 0° to 180° is traversed. In that case the gradient direction $\phi$ can traverse an angular range of from 0° to 180° in each of the measurement periods. However, it is alternatively possible to traverse an angular range of from 180° to 360° in the second measurement period and in the third measurement period an angular range of from 0° to 180° again, etc. In that case none of two successively measured sets of raw data will contain data which has been measured with the same gradient direction, but there will be data for which the gradient direction deviates by exactly 180°. In that case the frequency of the MR signal in the examination zone changes exactly in the reverse manner as a function of the location, so that for the interpolation the first value of one curve and the last value of the other curve must be taken into account and for the second value of the one curve the last value but one of the other curve, etc. The term "same measurement parameters" in the main claim must, therefore, be broadly interpreted in this sense.

The influencing of the temporal resolution by the sequence will be described in detail hereinafter with reference to the second through to the fourth diagram of FIG. 4.

In the second diagram of FIG. 4 the number of nuclei which can be influenced by the RF pulses generated by the RF transmission coil 11 is plotted as a function of time t. It is assumed that the nuclei are uniformly distributed throughout the examination zone. It is also assumed that during the acquisition of the second set of raw data (symmetrical relative to the instant $t_0$), the number of nuclei which was constant thus far is abruptly increased (for example, due to the introduction of an MR contrast medium into the examination zone), and that subsequently the number of nuclei abruptly drops to its original value again.

When a respective MR image is reconstructed from the raw data acquired during the three measurement cycles and when these three images are associated in time with the appropriate measurement periods, the variation of the intensity or brightness in the individual images as shown in the third diagram of FIG. 4 is obtained. Therein, the first and the third image are completely unaffected by the jump at the instant $t=t_0$, whereas in the second image the brightness increases. Because the jump occurs only during a time interval which is substantially shorter than the second measurement period, the brightness step in the third diagram in relation to the brightness before and after is not as pronounced as in the second diagram.

When instead in accordance with the method of the invention sets of auxiliary data are determined for a series of instants within the measurement period (for example, each time four instants per measurement period), and a respective MR image is reconstructed from these auxiliary data, in these images the variation in time of the intensity or the brightness as shown in the fourth diagram of FIG. 4 is obtained (said images then being valid only for ¼ of a measurement period). It appears that the intensity step in the image reconstructed for the instant $t=t_0$ again is not as pronounced as the contrast medium step according to the second diagram. However, it also appears that the intensity in the neighbouring images decreases step-wise to the stationary value (i.e. the comparatively short jump in the second diagram is strongly smoothed in time also according to the invention), but the fourth diagram also clearly shows when the contrast step has occurred, because the MR image reconstructed for the instant $t=t_0$ has the highest intensity. However, from the images produced directly from the raw data it cannot be recognize when the contrast medium jump has occurred within the second measurement time interval and its duration cannot be established either.

It would in principle be possible to associate also the images directly reconstructed from the raw data to an instant, for example the centre of the associated measurement period, and to reconstruct intermediate images from these images analogously to the method in accordance with the invention, but in these intermediate images the intensity maximum would always occur in the images associated with the centre of the second measurement period, regardless of the position in time of the contrast medium jump (second diagram) in relation to the second measurement period.

The fact that the position in time of the contrast medium jump cannot be reconstructed better by means of such intermediate images is due to the fact that during the reconstruction of an image the information concerning the time which is still present in the raw data is lost. This is because during the reconstruction for each pixel of the image there is reconstructed a value whereto a plurality of raw data contribute, said raw data having been measured at different instants. Therefore, to such a pixel there cannot be assigned a measurement instant which indicates the position in time more accurately than, for example the instant characterizing the centre of the measurement period.

This illustrates that the improved temporal resolution is achieved only when the auxiliary data is acquired from the raw data and not from the image data produced after the image reconstruction. Raw data in this sense is the data shown in FIG. 3 and obtained by one-dimensional Fourier transformation (curves R). However, for the raw dam use can also be made of the digital values which represent the variation in time of the MR signal and wherefrom the curves R are obtained by one-dimensional Fourier transformation. The first digital value determined during the interval around $t_1$ should then be interpolated with the first digital value determined during the interval around $t_2$, the second digital value at $t_1$ should be interpolated with the second digital value at $t_2$, etc.

For the described method only the raw data from always two sets were used to produce the auxiliary data. The interpolation, however, can also be performed with the raw data from three or more sets of raw data.

To those skilled in the art the construction of the signal processing device for performing the method in accordance with the invention in an MR apparatus as shown in FIG. 1 will be evident from the foregoing description. The MR signals received therein are amplified by a unit 20 and transposed in the baseband. The analog signal thus obtained is convened into a sequence of digital values by an analog-to-digital converter 21. The analog-to-digital converter 21 is controlled by a control unit 19 so that it generates digital data words only during the read-out phase (see last line of FIG. 2). The analog-to-digital converter 21 is succeeded by a Fourier transformation unit 22 which performs a one-dimensional Fourier transformation over the sequence of sampling values obtained by digitization of an MR signal, execution being so fast that the Fourier transformation is terminated before the next MR signal is received.

The raw data thus produced by Fourier transformation is written into a memory 23 whose storage capacity suffices for the storage of several sets of raw data. From these sets of raw data an interpolation unit 24 forms, in the described manner, sets of auxiliary data which are stored in a memory 25 whose storage capacity suffices for the storage of a large number of sets of auxiliary data. These sets of auxiliary data are calculated for different instants, the spacing of which is preferably small in comparison with the measurement period required for the acquisition of a set of raw data. A reconstruction unit 26, performing a filtered back-projection in known manner, produces MR images from the sets of raw data thus acquired, said MR images being stored. The MR images represent the examination zone at the predetermined instants. The series of the MR images thus obtained from the auxiliary data suitably reproduces the dynamic processes in the examination zone. If desired, this reconstruction unit can also derive MR images directly from the raw data in a conventional manner.

The units 20 to 26 are controlled by the control unit 19. As denoted by the downwards pointing arrows, the control unit also imposes the variation in time of the currents in the gradient coil systems 3, 5 and 7 as well as the central frequency, the bandwidth and the envelope of the RF pulses generated by the RF coil 11.

The memories 23 and 25 as well as the MR image memory (not shown) in the reconstruction unit 26 can be realised by way of a single memory of adequate capacity. The Fourier transformation unit 22, the interpolation unit 24 and the reconstruction unit 26 can be realised by way of a suitable data processor.

In the embodiment described above, the method of the invention was used to enable reproduction of a dynamic process, such as a contrast medium injection, with improved temporal resolution. However, the method is also suitable for enhanced reproduction of an object which is moved relative to the examination zone, for example a patient during introduction into the examination zone. For this introduction process the method of the invention producers a series of images with improved spatial resolution in the direction of introduction.

To this end there is provided an electric drive 9 for continuous displacement of the table top in its longitudinal direction (in the z direction), preferably at a constant speed. If the progression in time of the table top transport is not constant or not known in advance, the table top drive must be coupled to a sensor which supplies a signal corresponding to the position z of the table top. This sensor is denoted by the reference 8 in FIG. 1.

During displacement a plurality of series of sequences act on the examination zone, each series being composed of a number of sequences which may vary in time as shown in FIG. 2. The RF pulses (first line) accompanied by a gradient field (second line) extending in the z direction excite slices extending perpendicularly to the z direction. In principle the layers may also extend obliquely relative to the z direction, be it always at an angle which deviates from zero.

Subsequently, magnetic gradient fields $G_x$ and $G_y$ are generated in conformity with the third and the fourth line of FIG. 2. The amplitude ratio of $G_x$ and $G_y$ is varied from one sequence to another, so that the magnetic gradient field formed by the superposition of $G_x$ and $G_y$ changes its direction $\phi$ in space from one sequence to another. Even though the slice-selective RF pulses excite the nuclear magnetization in a respective slice which is situated at the centre of the examination zone and which is also referred to hereinafter as the measurement slice, the position of the patient, or the table top 4, relative to this slice changes due to the displacement of the table top. Consequently, each MR signal is dependent not only on the direction of the magnetic gradient field applied during its measurement but also on the relative position z of the patient 10, or the table top 4, relative to the measurement slice or the centre of the apparatus.

Figure 6:
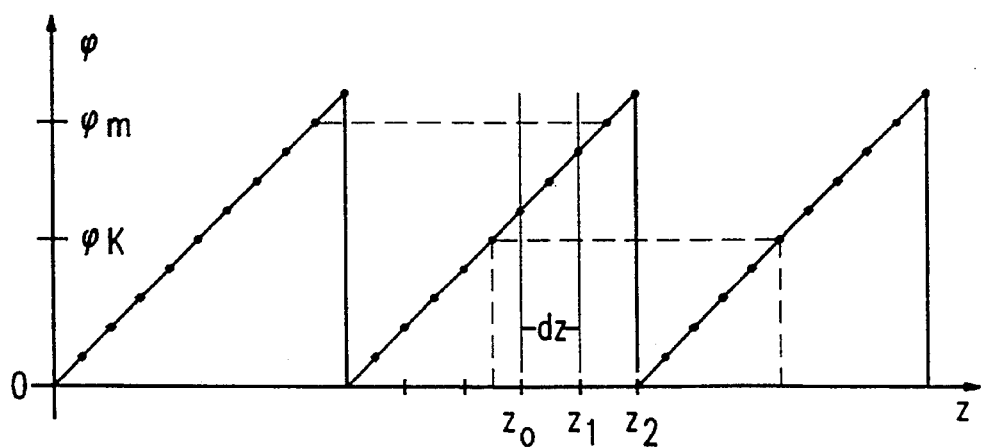
FIG. 6 shows the spatial assignment of the measurement slices during the displacement of a patient in the examination zone.

Thus, FIG. 6 shows the gradient direction so as a function of the position z during acquisition of a plurality of sets of raw data, it being assumed that for each set of raw data the gradient direction is increased in steps. The same variation in respect of z as in the diagram of FIG. 4 in respect of t is found; this can be attributed to the fact that the measurement instant at which an MR signal is acquired and the relative position z of the slice during acquisition of this MR signal are linked to one another via the displacement speed.

Consequently, analogously to the description given with reference to FIG. 4, for any position of a slice, for example $z_0$, a set of auxiliary data can be derived from the sets of raw data by interpolation, the image of the relevant slice being reconstructed from said auxiliary data. This can be repeated for other slices having the positions $z_1$, $z_2$ etc., said slices being spaced $d_z$ apart.

When these slice images are time-sequentially displayed (for example with the same distance in time as the traversing of the positions $z_0$, $z_1$, $z_2$ etc. by the table top 4), an image sequence with improved resolution in the z direction is obtained. Thus, the operator obtains already during introduction, or briefly thereafter, an image sequence which resembles a film and in which the patient is "traversed" one slice after the other, so that the identification of zones which are important for the subsequent MR examination is facilitated.

Another version of the described method consists in keeping the patient or the table top 4 stationary and in varying instead the position of the respective excited slice, relative to the patient or the examination zone, from one sequence to another. To this end, the central frequency of the slice-selective RF pulse (first line of FIG. 2) must be varied from one sequence to another. However, the displacement of the slice is restricted to the pan of the examination zone in which the steady magnetic field is still sufficiently uniform.

Even though the projection-reconstruction method shown in the FIGS. 2 and 3 is particularly suitable for use in conjunction with the invention, other MR methods can also be used, for example a 2-DF method or a 3-DF method.

We claim:

1. An MR method for two-dimensional or three-dimensional imaging of an examination zone, in which sets of raw data are successively measured with the same measurement parameters but at different instants ($T_1$, $T_2$) or with measurement parameters derived for different measurement slices, each set having sufficient information that an image of the examination zone can be reconstructed therefrom, wherein in order to produce an image representing the examination zone at a selectable instant ($t_0$), or in a selectable slice, a set of auxiliary data ($H(\phi_k, t_0)$) is generated by interpolation from at least two of the sets of raw data ($R(\phi_k, t_1)$, $R(\phi_k, t_2)$) with a weight ($g_k$) applied to the raw data entering the interpolation being greater as a time interval between the associated measurement instant and the selectable instant, or between the measurement slice and the selectable slice, is smaller, and an image of the examination zone is reconstructed from the set of auxiliary data.

2. An MR method as claimed in claim 1, characterized in that several sets of auxiliary data are generated, which sets represent the examination zone at different, instants, and that the images reconstructed therefrom are displayed as a sequence of images.

3. An MR method as claimed in claim 1, characterized in that the examination zone is imaged by way of an MR method in which a uniform, steady magnetic field acts on an examination zone, initially a first sequence which comprises at least one RF pulse acting on the examination zone in order to generate a first set of raw data, the MR signal thus generated being read in the presence of a magnetic gradient field having a gradient extending in a first direction, said first sequence being succeeded by further, similar sequences, the direction of the gradient being varied from one sequence to another until all directions have been traversed, a first set of raw data being produced by one-dimensional Fourier transformation over the MR signal acquired during these sequences, and the series of sequences being repeated at least once in order to obtain at least one further set of raw data.

4. An MR method for generating MR images as claimed in claim 1, characterized in that an object (10) to be examined is moved relative to the examination zone during the examination, sets of raw data being continuously measured during the movement, at least one set of auxiliary data being formed from said raw data, a respective MR image being reconstructed from said auxiliary data.

5. An MR apparatus comprising:

a magnet for generating a uniform, steady magnetic field, a gradient coil system for generating a magnetic gradient field whose gradient can be varied in respect of magnitude and/or direction, at least one RF coil system for generating RF pulses or for receiving MR signals, means for generating raw data from the MR signals, a control unit for controlling said means and coil systems so that successive sets of raw data are formed, each set of raw data having sufficient information to reconstruct an MR image of the examination zone, an interpolation unit for generating at least one set of auxiliary data in a manner than each set of auxiliary data is generated by interpolation from two or more sets of raw data, and a reconstruction unit for reconstructing an MR image of the examination zone from said at least one set of auxiliary data.

6. An MR method as claimed in claim 2, characterized in that the examination zone is imaged by way of an MR method in which a uniform, steady magnetic field acts on an examination zone, initially a first sequence which comprises at least one RF pulse acting on the examination zone in order to generate a first set of raw data, the MR signal thus generated being read in the presence of a magnetic gradient field having a gradient extending in a first direction, said first sequence being succeeded by further, similar sequences, the direction of the gradient being varied from one sequence to another until all directions have been traversed, a first set of raw data being produced by one-dimensional Fourier transformation over the MR signal acquired during these sequences, and the series of sequences being repeated at least once in order to obtain at least one further set of raw data.

7. An MR method for generating MR images as claimed in claim 2, characterized in that an object (10) to be examined is moved relative to the examination zone during the examination, sets of raw data being continuously measured during the movement, at least one set of auxiliary data being formed from said raw data, a respective MR image being reconstructed from said auxiliary data.

8. An MR method for generating MR images as claimed in claim 3, characterized in that an object (10) to be examined is moved relative to the examination zone during the examination, sets of raw data being continuously measured during the movement, at least one set of auxiliary data being formed from said raw data, a respective MR image being reconstructed from said auxiliary data.

9. An MR method for generating MR images as claimed in claim 6, characterized in that an object (10) to be examined is moved relative to the examination zone during the examination, sets of raw data being continuously measured during the movement, at least one set of auxiliary data being formed from said raw data, a respective MR image being reconstructed from said auxiliary data.

* * * * *